United States Patent
Sills et al.

(10) Patent No.: US 9,147,839 B2
(45) Date of Patent: Sep. 29, 2015

(54) MEMORY CELLS WITH RECESSED ELECTRODE CONTACTS

(71) Applicant: Micron Technology Inc., Boise, ID (US)

(72) Inventors: Scott E. Sills, Boise, ID (US); D. V. Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/019,061

(22) Filed: Sep. 5, 2013

(65) Prior Publication Data

US 2015/0060751 A1    Mar. 5, 2015

(51) Int. Cl.
*H01L 45/00* (2006.01)

(52) U.S. Cl.
CPC .......... *H01L 45/1253* (2013.01); *H01L 45/085* (2013.01); *H01L 45/1233* (2013.01); *H01L 45/16* (2013.01)

(58) Field of Classification Search
CPC .............. H01L 27/2472; H01L 45/146; H01L 45/1253; H01L 45/16
See application file for complete search history.

(56) References Cited

U.S. PATENT DOCUMENTS

| | | | |
|---|---|---|---|
| 5,896,312 A | 4/1999 | Kozicki et al. | |
| 7,071,485 B2 * | 7/2006 | Takaura et al. | 257/3 |
| 7,385,219 B2 | 6/2008 | Kozicki et al. | |
| 7,405,967 B2 | 7/2008 | Kozicki et al. | |
| 2009/0035514 A1 * | 2/2009 | Kang et al. | 428/131 |
| 2010/0259967 A1 * | 10/2010 | Yasuda et al. | 365/148 |

* cited by examiner

*Primary Examiner* — Matthew Reames
(74) *Attorney, Agent, or Firm* — Brooks, Cameron & Huebsch, PLLC

(57) ABSTRACT

Memory cells with recessed electrode contacts and methods of forming the same are provided. An example memory cell can include an electrode contact formed in a substrate. An upper surface of the electrode contact is recessed a distance relative to an upper surface of the substrate. A first portion of a memory element is formed on an upper surface of the electrode contact and the upper surface of the substrate.

11 Claims, 2 Drawing Sheets

MEMORY CELLS WITH RECESSED ELECTRODE CONTACTS

TECHNICAL FIELD

The present disclosure relates generally to semiconductor devices and more particularly to memory cells with recessed electrode contacts and methods of forming the same.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), resistance variable memory, and flash memory, among others. Types of resistance variable memory include phase change material (PCM) memory, programmable conductor memory, and resistive random access memory (RRAM), among others.

Non-volatile memory is utilized in memory devices for a wide range of electronic applications in need of high memory densities, high reliability, and data retention without power. Non-volatile memory may be used in, for example, personal computers, portable memory sticks, solid state drives (SSDs), digital cameras, cellular telephones, portable music players such as MP3 players, movie players, and other electronic devices.

Challenges related to memory device fabrication include decreasing the size of a memory device, decreasing the power consumption of a memory device, increasing the storage density of a memory device, and/or limiting memory device cost. As memory devices become increasingly smaller with memory cell feature size shrinking, the chance for disturb between memory cells in an array of memory cells can increase, the yield during the manufacturing process can decrease, and the reliability of memory cells during use can decrease.

DETAILED DESCRIPTION

Figure 1:
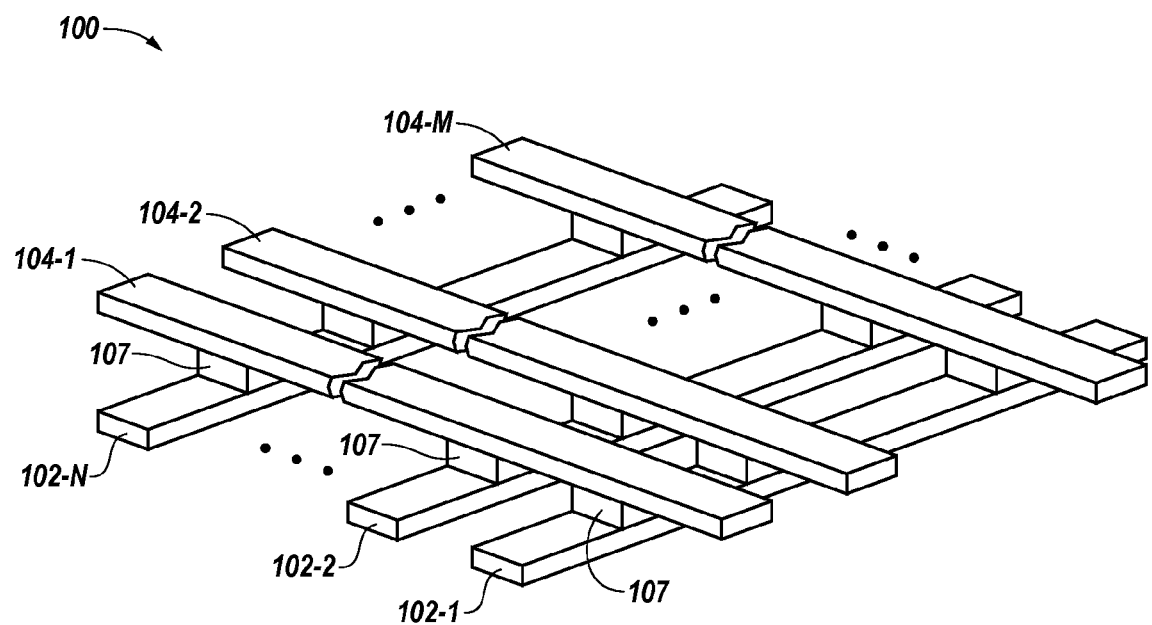
FIG. 1 is a block diagram of a portion of an array of memory cells according to a number of embodiments of the present disclosure.

Memory cells with recessed electrode contacts and methods of forming the same are provided. In one or more embodiments, a memory cell can include an electrode contact formed in a substrate, wherein an upper surface of the electrode contact is recessed a distance relative to an upper surface of the substrate; and a first portion of a memory element formed on an upper surface of the electrode contact and the upper surface of the substrate.

In a number of embodiments, memory cells having a recessed electrode contact and a portion of the memory element formed in a recess can improve the electrical properties of the memory cell by locally confining the electrical field, which can decrease disturb between memory cells in an array and enhance the reliability of memory cells.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 107 may reference element "07" in FIG. 1, and a similar element may be referenced as 207 in FIG. 2D. Also, as used herein, "a number of" a particular element and/or feature can refer to one or more of such elements and/or features.

FIG. 1 is a block diagram of a portion of an array 100 of memory cells 107 according to a number of embodiments of the present disclosure. In the example illustrated in FIG. 1, array 100 is a cross-point array having memory cells 107 located at the intersections of a first number of conductive lines 102-1, 102-2, . . . , 102-N (e.g., access lines, which may be referred to herein as word lines), and a second number of conductive lines 104-1, 104-2, . . . , 104-M (e.g., data/sense lines, which may be referred to herein as bit lines). As illustrated in FIG. 1, word lines 102-1, 102-2, . . . , 102-N can be substantially parallel to each other and are substantially orthogonal to bit lines 104-1, 104-2, . . . , 104-M, which can be substantially parallel to each other; however, embodiments are not so limited. In the embodiment illustrated in FIG. 1, memory cells 107 can function in a two-terminal architecture (e.g., with a particular word line 102-1, 102-2, . . . , 102-N and bit line 104-1, 104-2, . . . , 104-M serving as a first and second electrode for the cell 107).

Each memory cell 107 can include an active portion that includes memory element (e.g., a resistance variable memory element) coupled (e.g., in series) to a select device (e.g., an access device). The access device can be, for example, a diode or a transistor (e.g., a field effect transistor (FET) or bipolar junction transistor (BJT)), among others. The memory element can include a programmable portion that may have a variable resistance, for example. For instance, the memory element can include one or more resistance variable materials (e.g., a material programmable to multiple different resistance states, which can represent multiple different data states) such as, for example, a transition metal oxide material, or a perovskite including two or more metals (e.g., transition metals, alkaline earth metals, and/or rare earth metals). Other examples of resistance variable materials that can be included in the memory element of memory cells 107 can include various materials employing trapped charges to modify or alter conductivity, chalcogenides formed of various doped or undoped materials, binary metal oxide materials, colossal magnetoresistive materials, and/or various polymer based resistance variable materials, among others. Embodiments are not limited to a particular resistance variable material or materials. As such, memory cells 107 can be single level and/or multilevel resistive random access memory (RRAM) cells, spin torque transfer random access memory (STT RAM) cells, programmable conductor memory cells, phase change random access memory (PCRAM) cells, magnetoresistive random access memory cells, and/or conductive-bridging random access memory (CBRAM) cells, among various other types of memory cells.

In operation, memory cells 107 of array 100 can be programmed via programming signals (e.g., write voltage and/or current pulses) applied to the cells (e.g., the storage element of the cells) via selected word lines 102-0, 102-1, . . . , 102-N and bit lines 104-0, 104-1, . . . , 104-M. The magnitude (e.g., amplitude), duration (e.g., width), and/or number of programming pulses, for example, applied to memory cells 107 can be adjusted (e.g., varied) in order to program the cells to one of a number of different resistance levels corresponding to particular data states.

In a number of embodiments, a single level resistance variable memory cell may be programmed to one of two data states (e.g., logic 1 or 0). The memory cell may be programmed with a first programming signal, which will place the cell in a low resistance data state (e.g., logic 0) or the memory cell may be programmed with a second programming signal, which will place the cell in a relatively higher resistance data state (e.g., logic 1). In a number of embodiments, the difference in resistance between the low data resistance state and the high resistance data state of a memory cell can be referred to as the reading window. For example, a memory cell in the high resistance data state can have a resistance that is 10 times more that the resistance of the memory cell in the low resistance data state, therefore the reading window for the memory cell can be 10 times the low resistance level. Embodiments in the present disclosure are not limited to a particular reading window and the reading window can include a number of differences in resistance between a high resistance data state and a low resistance data state.

A sensing (e.g., read and/or program verify) operation can be used to determine the data state of a memory cell 107 (e.g., the resistance state of the storage element of a resistance variable memory cell 107) by sensing (e.g., read) a signal, for example, on a bit line 104-0, 104-1, . . . , 104-M associated with the respective cell responsive to a particular voltage applied to the selected word line 102-0, 102-1, . . . , 102-N to which the selected cell is coupled. Sensing the signal associated with the respective cell can include sensing a voltage, a current, an amplitude, and/or a slope (e.g. a time derivative of a parameter of the signal) of the signal, among other characteristics of the signal. In a number of embodiments where a memory cell includes a 3-terminal select device, a word line voltage can be used to select the memory cell and a signal through memory cell can be changed by voltage difference between a bit line and a source of the selected memory cell to vary the resistance level of the memory cell, for example.

Figure 2A:
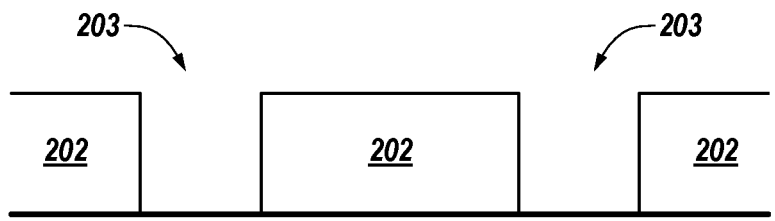
FIGS. 2A-2D illustrate various process stages associated with forming memory cells according to a number of embodiments of the present disclosure.

FIGS. 2A-2D illustrate various process stages associated with forming memory cells in accordance with a number of embodiments of the present disclosure. FIG. 2A illustrates a cross-sectional view of a portion of an array of memory cells in accordance with a number of embodiments of the present disclosure.

FIG. 2A illustrates a substrate 202 with openings 203 formed in the substrate 202. Openings 203 can be formed by removing, e.g., etching, a portion of the substrate. The etching of substrate to form openings 203 can include masking and etching to expose a sub-structure below the substrate 202 that can include an electrode and/or an access device, for example.

Figure 2B:
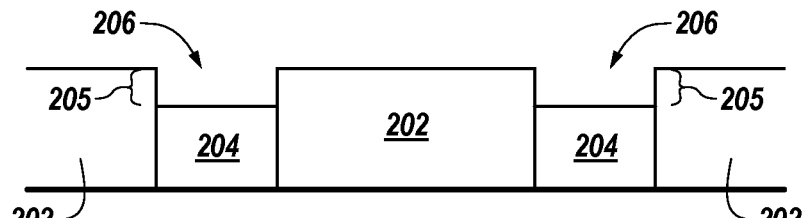

FIG. 2B illustrates a process stage subsequent to that shown in FIG. 2A that is associated with forming memory cells in accordance with a number of embodiments of the present disclosure. FIG. 2B illustrates electrode contacts 204 formed in openings 203. In a number of embodiments, the electrode contacts 204 can be bottom electrode contacts, for example. The electrode contacts 204 can be formed from a material that is conductive, such as titanium nitride (TiN), for example. However, embodiments of the present disclosure are not limited to a particular type of electrode contact material.

The electrode contacts 204 can be deposited and then recessed using an etch and/or polish such that the upper surface of the electrode contacts 204 in openings 203 are recessed below the upper surface of the substrate 202. As such, the electrode contacts 204 in openings 203 are formed such that an upper surface is below the upper surface of the substrate 202 to provide recesses 206. Recesses 206 can have a depth 205 of approximately 2-5 nanometers (nm), among other depths. In a number of embodiments, the electrode contacts 204 can be formed by filling openings 203 with an electrode contact material and removing a portion of the electrode contact material so that the upper surface of the electrode contacts 204 are recessed below the upper surface of the substrate 202. In a number of embodiments, the electrode contacts 204 can be formed by using a damascene process to form the electrode contact material in openings 203, so the upper surface of the electrode contacts 204 are recessed below the upper surface of the substrate 202.

Figure 2C:
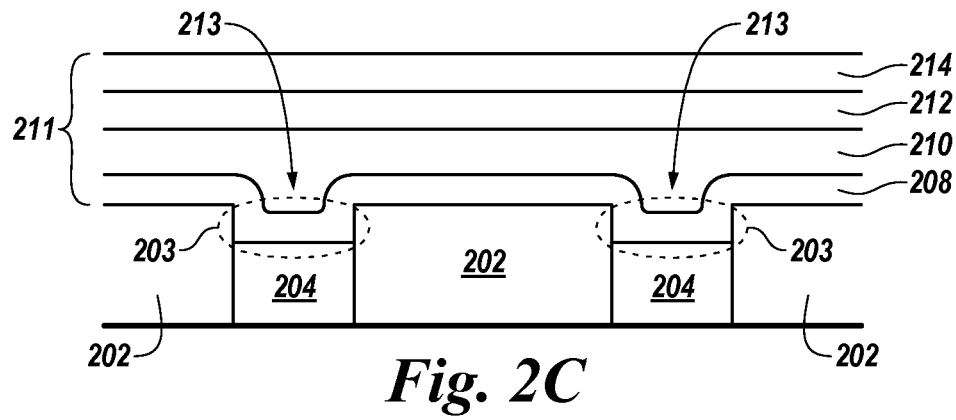

FIG. 2C illustrates a process stage subsequent to that shown in FIG. 2B that is associated with forming memory cells in accordance with a number of embodiments of the present disclosure. FIG. 2C illustrates a first portion of a memory element 208 formed on the upper surface of the electrode contacts 204, the upper surface of the substrate 202, and on the sidewalls of the substrate 202 in recesses 206 (shown in FIG. 2B). The first portion of the memory element 208 can be formed on the upper surface of the electrode contacts 204, the upper surface of the substrate 202, and on the sidewalls of the substrate 202 in recesses 206 (shown in FIG. 2B) using a physical vapor deposition (PVD) process, for example. The first portion of the memory element 208 can be patterned to create an active portion 203 of the memory cells. The active portion 203 of the memory cells can be the portion of the memory cells that change resistance during operation of the memory cells. In FIG. 2C, the first portion of the memory element 208 can be a resistive variable material, for example.

In a number of embodiments, forming the first portion of the memory element 208 in a recess 206 can cause a recess 213 to be formed in the first portion of the memory element 208. In a number of embodiments, a second portion of the memory element 210 can be formed on the first portion of the memory element 208 in the recess 213. The second portion of the memory element 210 can be an ion source for the memory cells, such as copper telluride (CuTe) or silver sulfide ($Ag_2S$), for example. However, embodiments of the present disclosure are not limited to a particular type of memory element material.

The second portion of the memory element 210 can be formed, e.g., deposited and planarized, in the recess 213 of the first portion of the memory cell 208. The second portion of the memory element 210 can be formed by a physical vapor deposition (PVD) process, among other deposition processes, for example. Forming the first portion of the memory cell in a recess 206 and the second portion of the memory cell in a recess 213 can confine (shown in FIG. 2D) the first portion 208 and second portion 210 of the memory element resulting in localized confinement of the electric field that can help to isolate the memory cell from adjacent memory cells and enhance the reliability of the memory cell. As shown in FIG. 2C, a second electrode material 212 can be formed, e.g., deposited and planarized, on the second portion of the memory element 210. An insulating material 214, such as silicon nitride ($Si_3N_4$), can be formed, e.g., deposited and planarized, on the second electrode 212, e.g., top electrode. The first portion of the memory element 208, the second portion of the memory element 210, the second electrode 212 and insulating material 214 can form the material stack 211 shown in FIG. 2C.

In a number of embodiments, a memory cell can include a number of portions of memory elements. The number of portions of memory elements can include of a number of combinations of memory element materials. The memory element materials can be any material used by the memory cell to correlate an electrical characteristic of the memory cell to a data state. In embodiments having only a first portion of a memory element formed in a recess, such as recess 206 of FIG. 2B, the second electrode of the memory cell can be formed in the recess of the first portion of the memory element. In embodiments with a plurality of portions of memory elements, each subsequently formed memory element portion can be formed in a recess of a memory element portion that was previously formed and the second electrode can be formed on the final memory element portion.

Figure 2D:
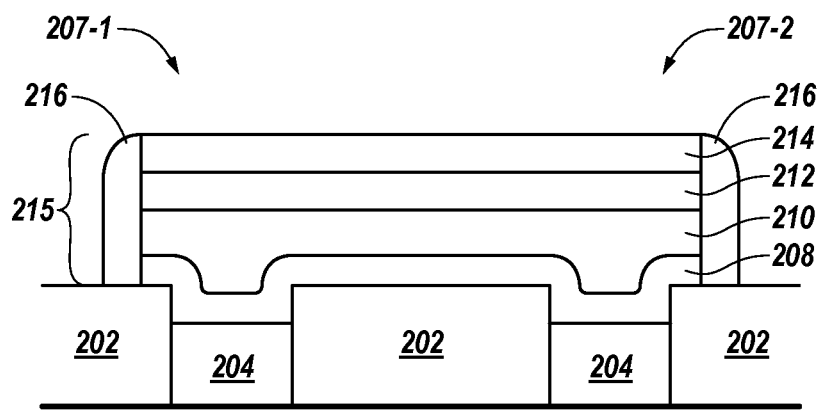

FIG. 2D illustrates a process stage subsequent to that shown in FIG. 2C that is associated with forming memory cells in accordance with a number of embodiments of the present disclosure. As one of ordinary skill in the art will appreciate, the material stack 211 shown in FIG. 2C can further be patterned, e.g., masked, and etched to remove a portion the material stack 211, which includes the first portion of the memory element 208, the second portion of the memory element 210, the second electrode material 212, and the insulating material 214. For example, an etch process, where the insulating material 214 acts as a hard mask, can be used to remove of a portion of the material stack 211 to isolate memory cells 207-1 and 207-2 from adjacent memory cells in the array (not shown). As shown in the example of FIG. 2D, an insulating material 216 can be formed on the resulting material stack 215 and a portion of the insulating material 216 can be removed leaving insulating material 216 on the sidewalls of material stack 215. The material stack 215 includes the first portion of the memory element 208, the second portion of the memory element 210, the second electrode 212, and the insulating material 214 remaining after the etch process to further isolate memory cells 207-1 and 207-2 from adjacent memory cells in the array (not shown).

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A memory cell, comprising:
    an electrode contact formed in a substrate, wherein a sidewall of the electrode contact is adjacent to a sidewall of the substrate and wherein an upper surface of the electrode contact is recessed a distance relative to an upper surface of the substrate and the upper surface of the electrode is between the upper surface of the substrate and a lower surface of the substrate;
    a first portion of a memory element formed on an upper surface of the electrode contact, the upper surface of the substrate, and the sidewall of the substrate; and
    a second portion of the memory element is formed in a recess of the first portion of the memory element.

2. The memory cell of claim 1, wherein the first portion of the memory element is formed on sidewalls of a recess between the upper surface of the substrate and the upper surface of the electrode contact.

3. The memory cell of claim 2, wherein the recess between the upper surface of the substrate and the upper surface of the electrode contact is between 2-5 nanometers (nm) deep.

4. The memory cell of claim 1, wherein the second portion of the memory elements is an ion source material.

5. The memory cell of claim 1, wherein the first portion of the memory element is formed via physical vapor deposition (PVD).

6. The memory cell of claim 1, wherein the first portion of the memory element is a resistance variable material.

7. A memory array, comprising:
    a substrate, wherein a number of openings are formed in the substrate;
    a number of first electrode contacts, wherein a sidewall of each of the number of first electrode contacts are adjacent to a sidewall of the substrate, wherein one of the number of first electrode contacts are formed in each of the number of openings in the substrate, and wherein an upper surface of the number of first electrode contacts is recessed a distance below an upper surface of the substrate, and wherein the upper surface of the first electrode contacts is between the upper surface of the substrate and a lower surface of the substrate;
    a first memory element material is formed on an upper surface of the number of first electrode contacts, an upper surface of the substrate, and the sidewall of the substrate; and
    a second memory element material is formed on the first memory element material in a recess of the first memory element material.

8. The memory array of claim 7, wherein a second electrode is formed on the second memory element material.

9. The memory array of claim 7, wherein the distance between the upper surface of each of the number of first electrode contacts and the upper surface of the substrate is approximately 2-5 nm.

10. The memory array of claim 7, wherein the first memory element material includes recesses formed above the recessed upper surface of the number of first electrode contacts.

11. The memory array of claim 7, wherein the first portion of the memory element is formed according to a physical vapor deposition (PVD) process.

* * * * *